(12) United States Patent
Parris et al.

(10) Patent No.: US 7,609,570 B2
(45) Date of Patent: Oct. 27, 2009

(54) SWITCHED CAPACITOR CHARGE SHARING TECHNIQUE FOR INTEGRATED CIRCUIT DEVICES ENABLING SIGNAL GENERATION OF DISPARATE SELECTED SIGNAL VALUES

(75) Inventors: Michael C. Parris, Colorado Springs, CO (US); Douglas B. Butler, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 263 days.

(21) Appl. No.: 11/625,728

(22) Filed: Jan. 22, 2007

(65) Prior Publication Data

US 2008/0175074 A1 Jul. 24, 2008

(51) Int. Cl.
*G11C 11/00* (2006.01)
(52) U.S. Cl. ...................................... 365/202; 365/205
(58) Field of Classification Search ................. 365/202, 365/205
See application file for complete search history.

(56) References Cited

U.S. PATENT DOCUMENTS

| | | | | |
|---|---|---|---|---|
| 3,906,488 A | * | 9/1975 | Suarez-Gartner | ........... 341/108 |
| 4,413,330 A | * | 11/1983 | Chao et al. | ................. 365/205 |
| 4,421,996 A | * | 12/1983 | Chuang et al. | ................. 327/57 |
| 4,570,121 A | * | 2/1986 | Carbrey | ....................... 341/159 |
| 4,638,463 A | * | 1/1987 | Rockett, Jr. | .................. 365/205 |
| 7,449,923 B2 | * | 11/2008 | Braswell et al. | ............... 327/96 |
| 2001/0052811 A1 | * | 12/2001 | Kim | ............................ 327/536 |
| 2004/0047221 A1 | * | 3/2004 | Tanaka | ........................ 365/222 |
| 2005/0130618 A1 | * | 6/2005 | Staszewski et al. | ......... 455/255 |
| 2005/0134368 A1 | * | 6/2005 | Chandrasekaran | ............. 330/9 |

OTHER PUBLICATIONS

Yamauchi, Hiroyuki, Akamatsu, Hironori, Fujita, Tsutomu, An Asymptotically Zero Power Charge-Recycling Bus Architecture for Battery-Operated Ultrahigh Data Rate ULSI's, IEEE Journal of Solid-State Circuits, vol. 30, No. 4, Apr. 1995, pp. 423-431.
Rajapandian, Saravanan, Shepard, Kenneth L., Hazucha, Peter, Karnik, Tanay, High-Voltage Power Delivery Through Charge Recycling, IEEE Journal of Solid-State Circuits, vol. 41, No. 6, Jun. 2006, pp. 1400-1410.

* cited by examiner

*Primary Examiner*—Michael T Tran
(74) *Attorney, Agent, or Firm*—Peter J. Meza; William J. Kubida; Hogan & Hartson LLP (57) ABSTRACT

A switched capacitor charge sharing technique for integrated circuit devices which allows for efficient charge sharing and signal level generation of exact desired values, and wherein the signal levels of the circuits sharing the charge do not have to have the same voltage levels. In a particular embodiment of the technique of the present invention disclosed herein, a switched capacitor is used to share charge between, for example, two different signals or two different groups of signals. The size of the capacitor can be adjusted to obtain the required signal level of the various signals.

38 Claims, 13 Drawing Sheets

SWITCHED CAPACITOR CHARGE SHARING TECHNIQUE FOR INTEGRATED CIRCUIT DEVICES ENABLING SIGNAL GENERATION OF DISPARATE SELECTED SIGNAL VALUES

BACKGROUND OF THE INVENTION

The present invention relates, in general, to the field of semiconductor integrated circuit devices. More particularly, the present invention relates to a switched capacitor charge sharing technique for integrated circuit devices enabling signal generation of disparate selected signal values.

Charge sharing techniques have previously been employed in integrated circuit designs in order to save operating power. A typical circuit example is one utilized in conjunction with dynamic random access memory (DRAM) array bitlines which are precharged to a level of VCC/2 then driven to VCC (supply voltage level) or VSS (circuit ground) for the bit line (BL) and complementary bit line bar (/BL or BLB) depending on the state of the previously stored data.

Other contemporary circuit examples include the use of three groups of logic gates operating at three different voltage ranges. In operation, one group will transition from VCC/3 to VSS, the second group from 2VCC/3 to VCC/3 and the third group from VCC to 2VCC/3. In this manner, these three groups of logic gates can charge share with their adjacent voltage range group, but conventional designs are constrained to operate in this manner. Stated another way, with current circuit techniques the low level of signal or circuit block A is set equal to the high level of the adjacent signal or circuit block B.

What is desired then, is the provision of a charge sharing technique that allows for selected signal, or operating, levels without concern for the number of circuit blocks used to share the charge. In other words, it would highly advantageous to provide, for example, two circuit blocks that can charge share with each other but have VCC/10 operating levels. That is, one signal or block could operate in the range of VCC to 0.9VCC while another signal or block operates between VSS to 0.1 VCC with the two signal generators charge sharing with each other.

SUMMARY OF THE INVENTION

The technique of the present invention overcomes the limitations of existing charge sharing circuit techniques by allowing for efficient charge sharing and signal level generation of exact desired values, and wherein the signal levels of the circuits sharing the charge do not have to have the same voltage levels.

In a particular embodiment of the technique of the present invention disclosed herein, a switched capacitor is used to share charge between two different signals, (e.g. alternating current (AC) signals) or two different groups of signals. The size of the capacitor can be adjusted to obtain the required signal level of the various signals. The smaller the capacitor, the smaller the signal level. As the capacitor approaches an infinite number of farads, the signal levels approach the level of VCC/2. If the capacitor is approximately the capacitance of the signal lines, the signal levels are then approximately VCC/3.

One particular method of implementing the technique of the present invention is to precharge a signal line to each side of a capacitor on every other precharge cycle. A second signal line is precharged to the opposite side of this capacitor to the first signal line and is charged every other cycle as well.

Particularly disclosed herein is a charge sharing method which comprises providing a capacitor having first and second terminals thereof, firstly coupling a first signal line to the first terminal of the capacitor and coupling a second signal line to the second terminal of the capacitor, firstly decoupling the first and second signal lines from the first and second terminals of the capacitor respectively, secondly coupling the first signal line to the second terminal of the capacitor and coupling the second signal line to the first terminal of the capacitor, secondly decoupling the first and second signal lines from the second and first terminals of the capacitor respectively and repeating the process of firstly coupling, firstly decoupling, secondly coupling and secondly decoupling.

Also particularly disclosed herein is a charge sharing circuit for first and second pairs of complementary signal lines which comprises a capacitor coupled between first and second circuit nodes, a first input circuit having an output coupled to a first one of the first pair of complementary signal lines, with the first input circuit being coupled between a supply voltage source and a second one of the first pairs of complementary signal lines. A second input circuit has an output coupled to the second one of the first pair of complementary signal lines, with the first input circuit being coupled between the supply voltage source and the first circuit node. A first switching device selectively couples the first one of the first pair of complementary signal lines to the first circuit node and a third input circuit has an output coupled to a first one of the second pair of complementary signal lines, with the third input circuit being coupled between a reference voltage level and a second one of the second pair of complementary signal lines. A fourth input circuit has an output coupled to the second one of the second pair of complementary signal lines, with the fourth input circuit being coupled between the reference voltage level and the second circuit node. A first output circuit is coupled to the first and second ones of the first pair of complementary signal lines and the second circuit node and a second output circuit is coupled to the first and second ones of the second pair of complementary signal lines and the first circuit node. A second switching device selectively couples the first one of the second pair of complementary signal lines to the second circuit node.

Further particularly disclosed herein is a charge sharing circuit for first and second pairs of complementary signal lines which comprises a capacitor coupled between first and second circuit nodes and a first circuit coupled between a supply voltage source and a reference voltage level and coupled to first ones of the first and second pairs of complementary signal lines and the first circuit node. A second circuit is coupled between the supply voltage source and the reference voltage level and is coupled to second ones of the first and second pairs of complementary signal lines and the second circuit node. A third circuit is coupled between the first ones of the first and second pairs of complementary signal lines and to the second circuit node and a fourth circuit is coupled between the second ones of the first and second pairs of complementary signal lines and to the first circuit node.

Still further particularly disclosed herein is a data read driver for an integrated circuit memory array which comprises a first transistor responsive to a data read signal for coupling a supply voltage to a local data read line, a second transistor responsive to a global clock signal for coupling a reference voltage level to a global data read line and a charge sharing circuit coupled between the local data read line and the global data read line.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
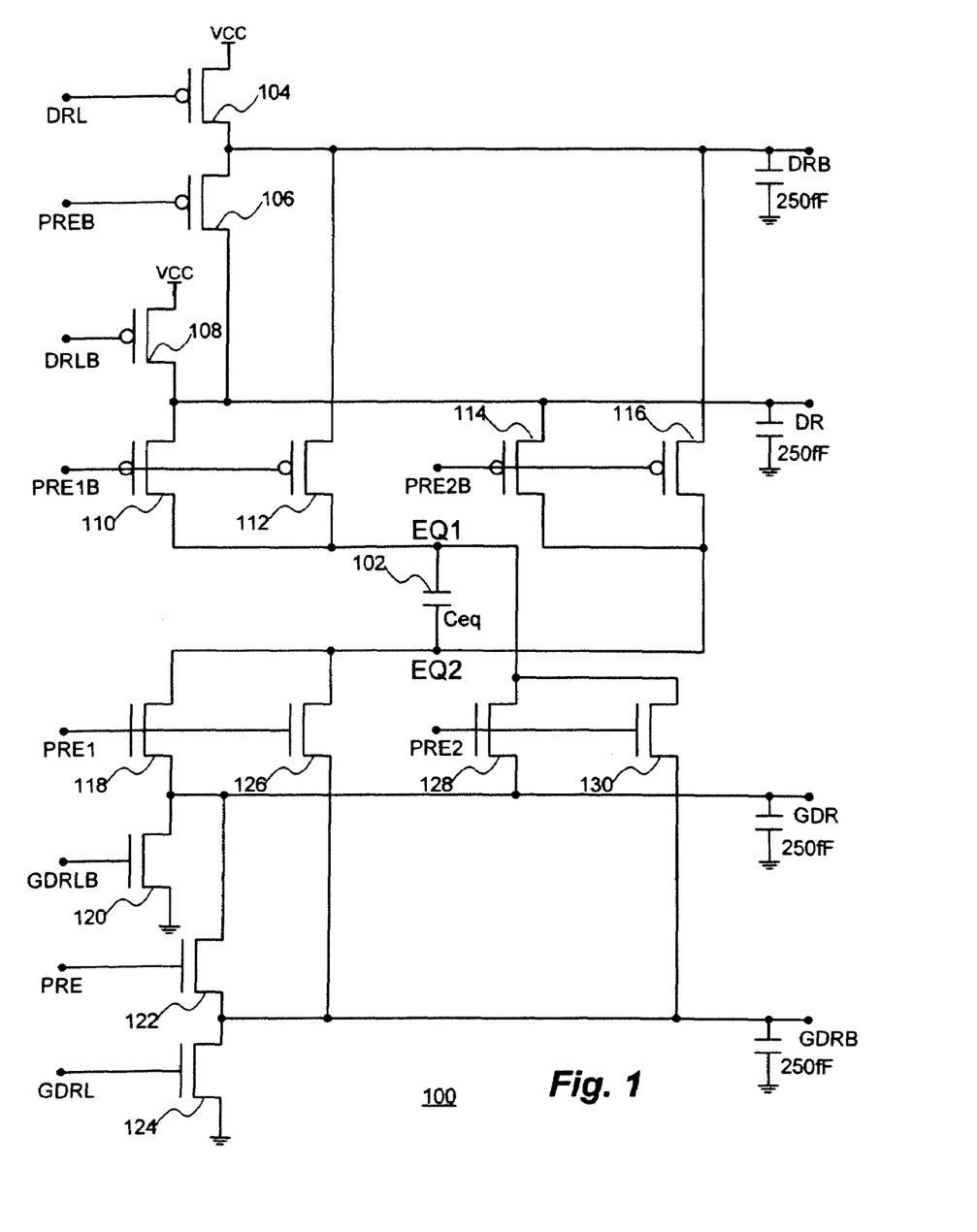
FIG. 1 is a schematic illustration of a representative data read, global data read driver circuit in accordance with an implementation of the technique of the present invention.

With reference now to FIG. 1, a schematic illustration of a representative data read, global data read driver circuit 100 in accordance with an implementation of the technique of the present invention is shown.

The circuit 100 comprises, in pertinent part, a capacitor 102 (Ceq) coupled between nodes EQ1 and EQ2. The circuit 100 further comprises series connected P-channel transistors 104 and 106 having the signals DRL and PREB respectively coupled to their gate terminals. Series connected P-channel transistors 108 and 110 are also provided coupled between a supply voltage source (VCC) and the node EQ1 and have the signals DRLB and PRE1B respectively coupled to their gate terminals. Transistors 104 and 106 are coupled between VCC and the node intermediate transistors 108 and 110 which is denominated DR. The node intermediate transistors 104 and 106 is denominated DRB.

P-channel transistor 112 is coupled between node DRB and node EQ1 and receives the signal PRE1B at its gate terminal, while P-channel transistor 114 is coupled between node DR and node EQ2. P-channel transistor 116 is coupled between node DRB and node EQ2 as shown. The gate terminals of transistors 114 and 116 commonly receive the PRE2B signal.

Similarly, the circuit 100 comprises series connected N-channel transistors 122 and 124 having the signals PRE and GDRL respectively coupled to their gate terminals. Series connected N-channel transistors 118 and 120 are also provided coupled between a reference voltage source (VSS) and the node EQ2 and have the signals PRE1 and GDRLB respectively coupled to their gate terminals. Transistors 122 and 124 are coupled between VSS and the node intermediate transistors 118 and 120 which is denominated GDR. The node intermediate transistors 122 and 124 is denominated GDRB.

N-channel transistor 126 is coupled between node GDRB and node EQ2 and receives the signal PRE1 at its gate terminal, while N-channel transistor 128 is coupled between node GDR and node EQ1. N-channel transistor 130 is coupled between node GDRB and node EQ1 as shown. The gate terminals of transistors 128 and 130 commonly receive the PRE2 signal. A capacitance of 250 fF appears on the local and global data read lines DR/DRB and GDR/GDRB as shown.

Figure 2:
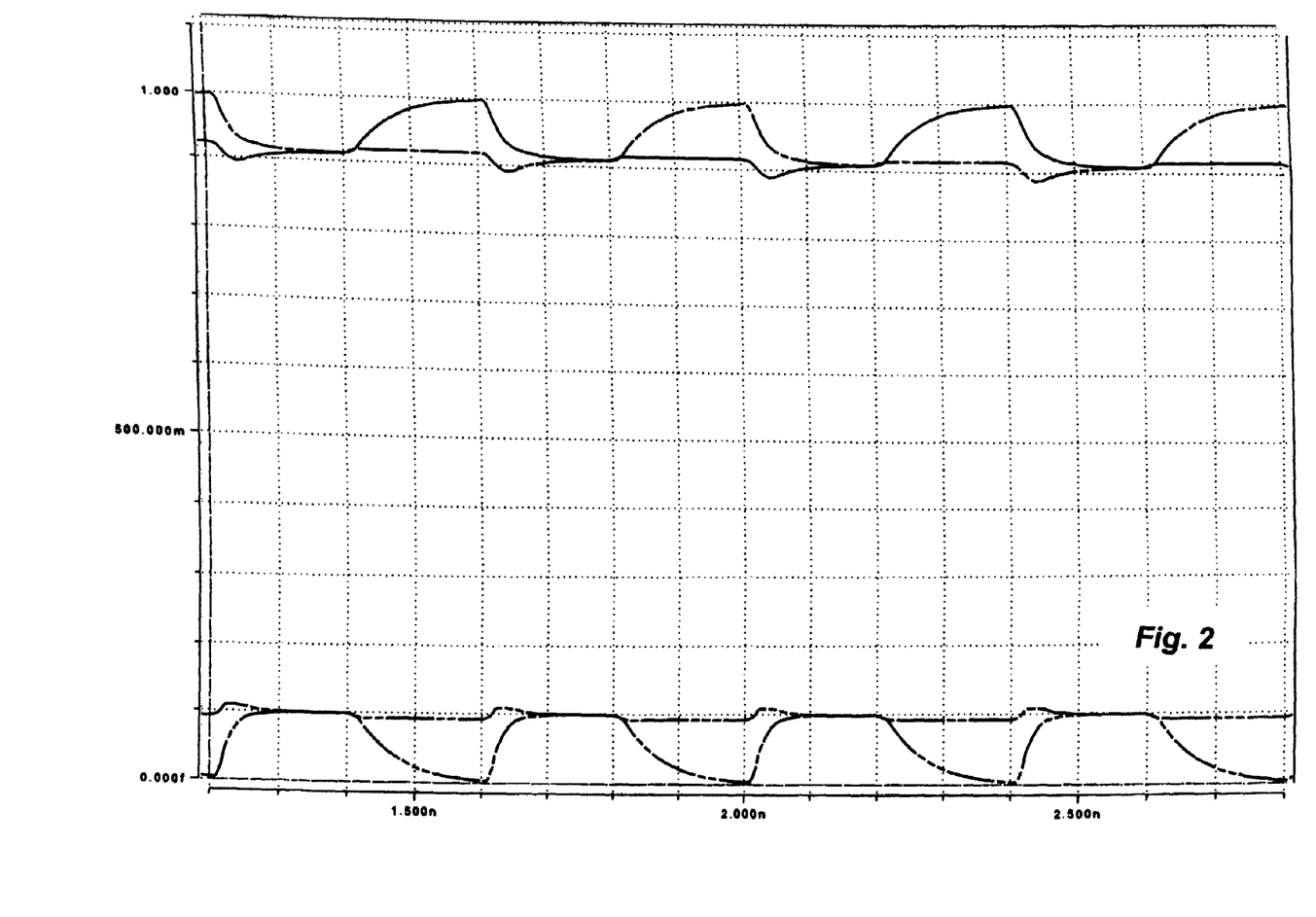
FIG. 2 is a series of waveforms produced by the circuit 100 of the preceding figure illustrating the signals on the complementary global data read (GDR and GDRB) and local data read (DR and DRB) lines with a capacitance Ceq=10 fF.

With reference additionally now to FIG. 2, a series of waveforms produced by the circuit 100 of the preceding figure is shown illustrating the signals on the complementary global data read (GDR and GDRB) and local data read (DR and DRB) lines. In this illustration, capacitor 102 has a capacitance of Ceq=10 fF. At the top of the figure, the DR and DRB lines are shown to transition between substantially 1.0 volts to 1.0 volts minus 100 millivolts while at the bottom of the figure, the GDR an GDRB lines are shown to transition between substantially 0.0 volts and 100 millivolts.

Figure 3:
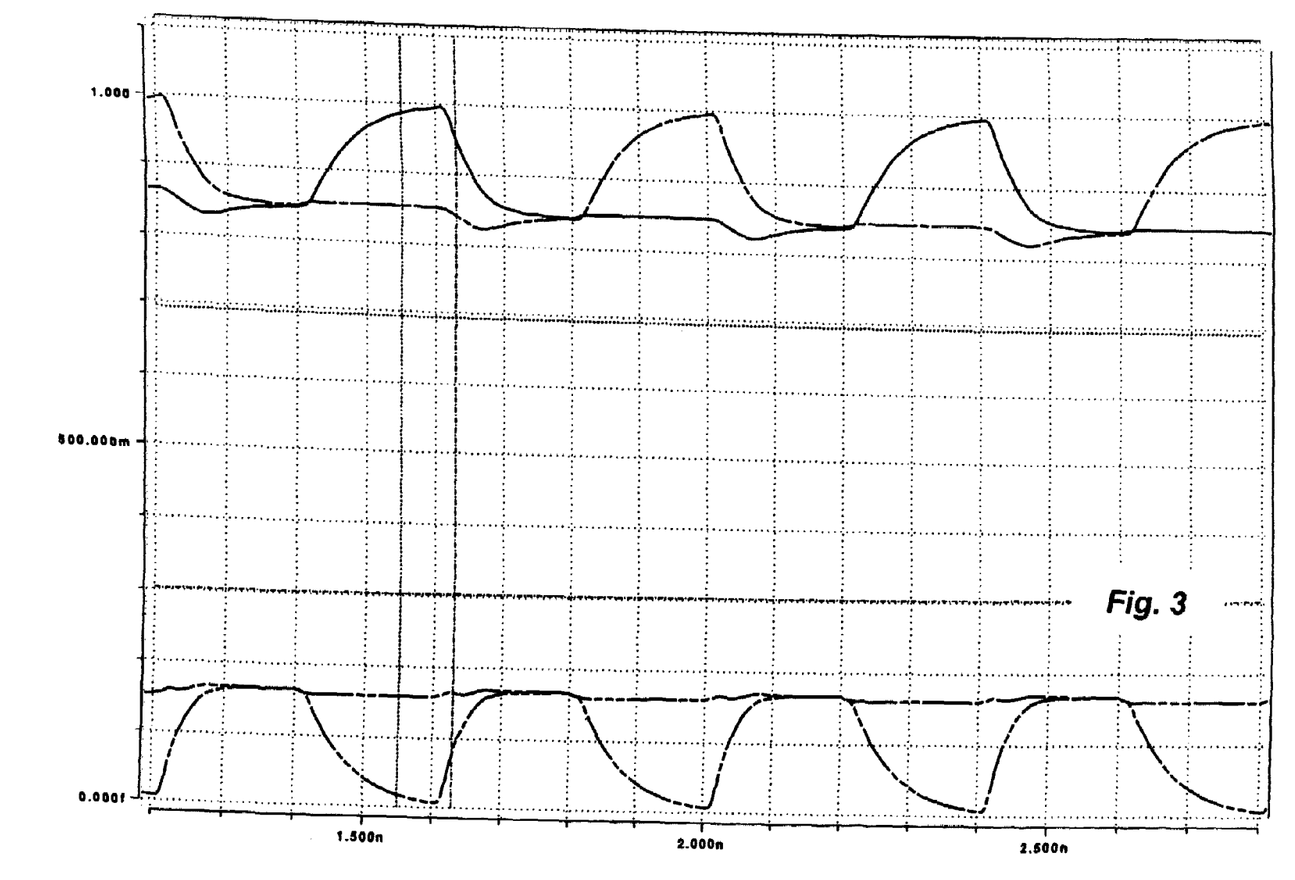
FIG. 3 is an additional series of waveforms produced by the circuit 100 of FIG. 1 illustrating the signals on the complementary GDR, GDRB, DR and DRB lines with a capacitance Ceq=25 fF.

With reference additionally now to FIG. 3, an additional series of waveforms produced by the circuit 100 of FIG. 1 is shown illustrating the signals on the complementary GDR, GDRB, DR and DRB lines. In this illustration, capacitor 102 has a capacitance of Ceq=25 fF. In this configuration, the DR and DRB lines at the top are shown to transition between substantially 1.0 volts to 1.0 volts minus 150 millivolts while at the bottom of the figure, the GDR an GDRB lines are shown to transition between substantially 0.0 volts and 150 millivolts.

Figure 4:
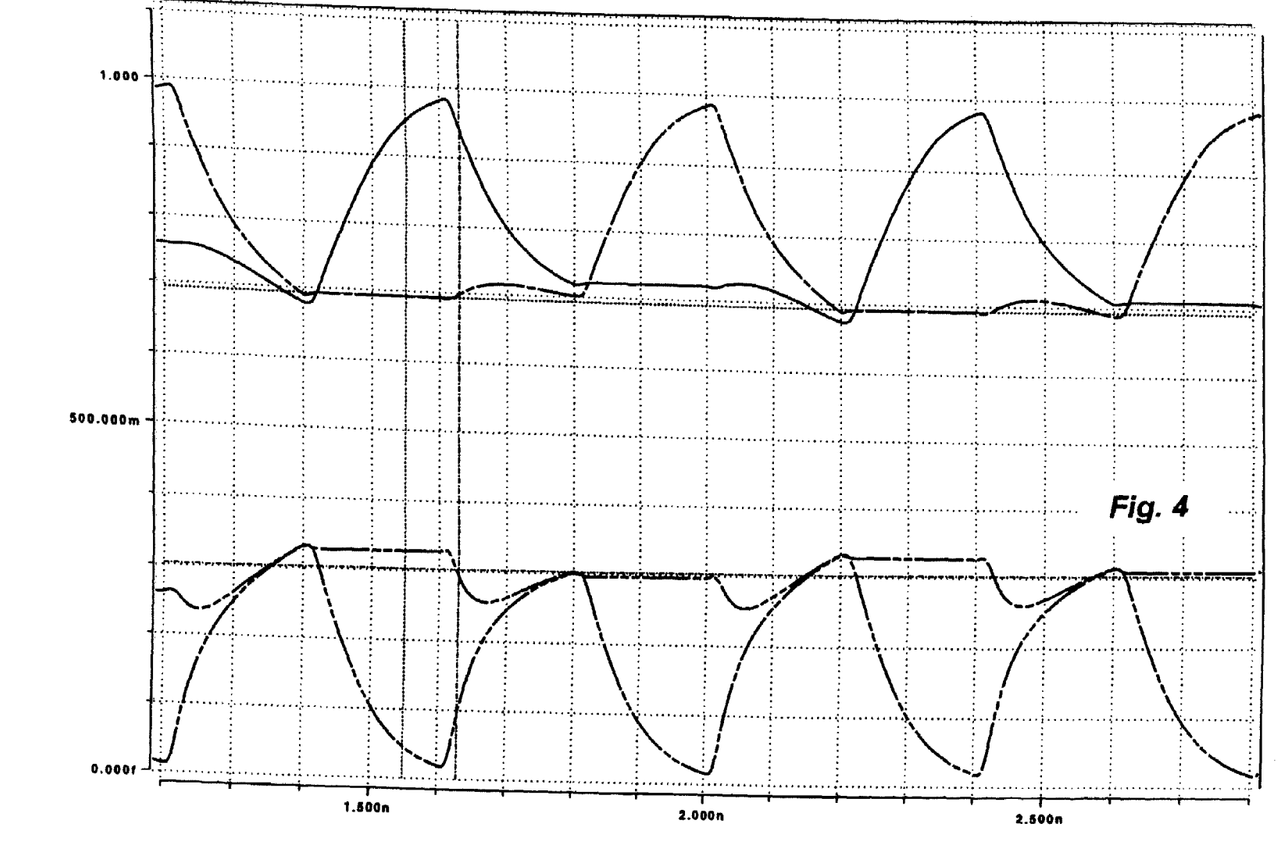
FIG. 4 is a further series of waveforms produced by the circuit 100 of FIG. 1 illustrating the signals on the complementary GDR, GDRB, DR and DRB lines with a capacitance Ceq=250 fF.

With reference additionally now to FIG. 4, a further series of waveforms produced by the circuit 100 of FIG. 1 is shown illustrating the signals on the complementary GDR, GDRB, DR and DRB lines. In this illustration, capacitor 102 has a capacitance of Ceq=250 fF. In this configuration, the DR and DRB lines at the top are shown to transition between substantially 1.0 volts to 1.0 volts minus 300 millivolts while at the bottom of the figure, the GDR an GDRB lines are shown to transition between substantially 0.0 volts and 300 millivolts.

Figure 5:
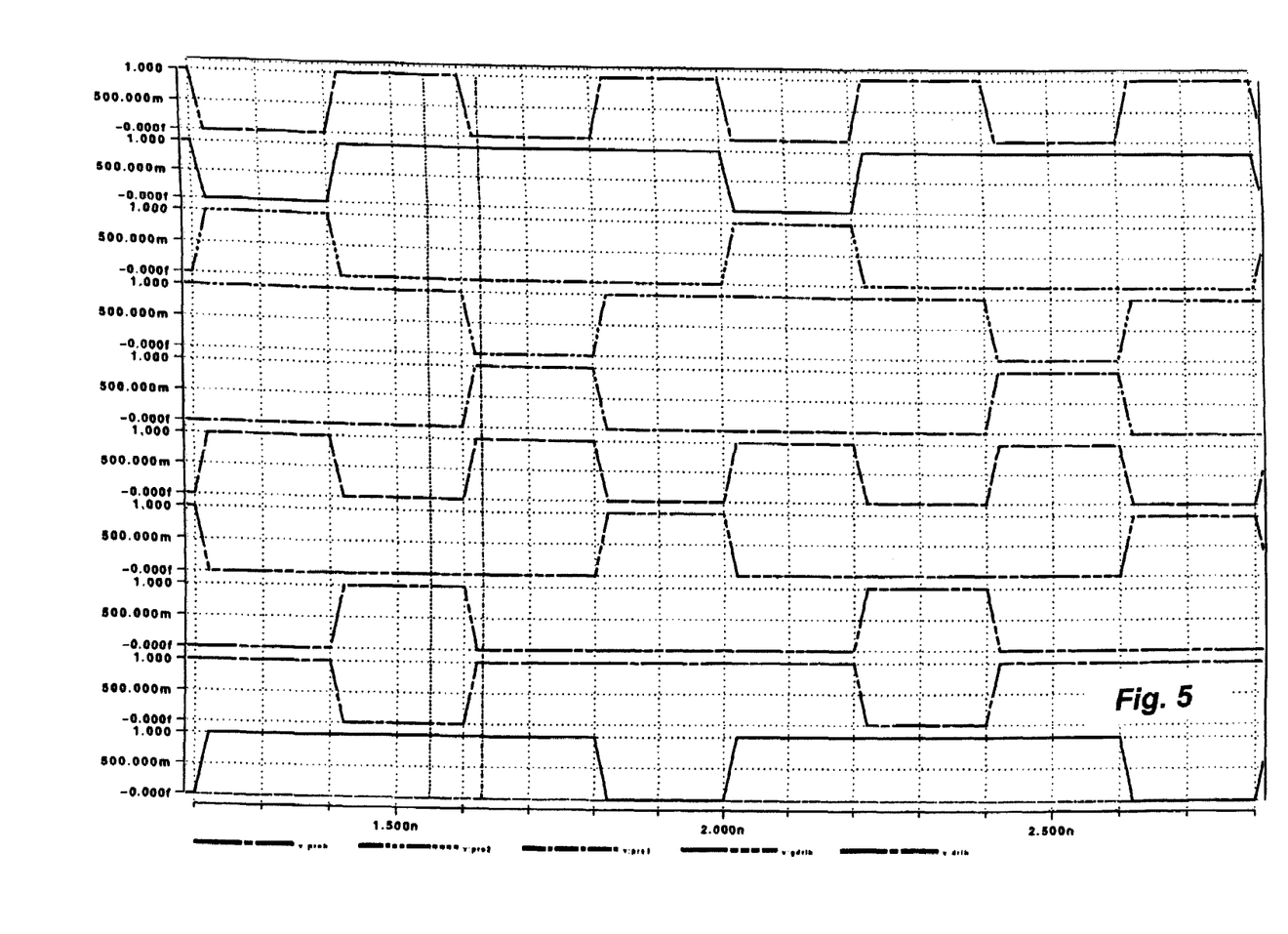
FIG. 5 is a final series of waveforms produced by the circuit 100 of FIG. 1 illustrating, in descending order, the signals on the PREB, PRE2B, PRE2, PRE1B, PRE1, PRE, GDRLB, GDRL, DRLB and DRL lines with a capacitance Ceq=10 fF.

With reference additionally now to FIG. 5, a final series of waveforms produced by the circuit 100 of FIG. 1 is shown illustrating, in descending order, the signals on the PREB, PRE2B, PRE2, PRE1B, PRE1, PRE, GDRLB, GDRL, DRLB and DRL lines. In this illustration, capacitor 102 has a capacitance of Ceq=10 fF.

Figure 6:
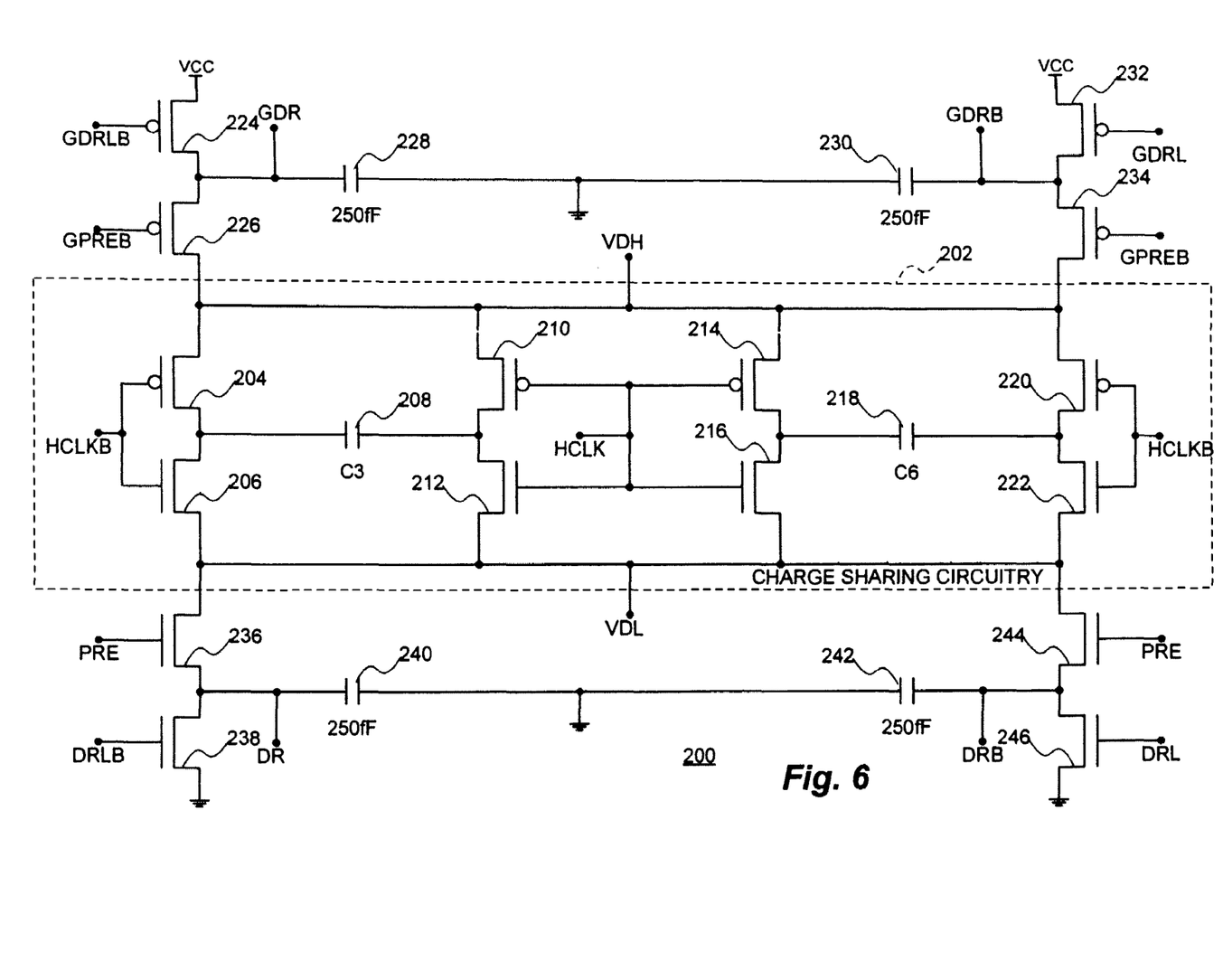
FIG. 6 is a schematic illustration of another embodiment of a representative data read, global data read driver circuit in accordance with an implementation of the technique of the present invention.

With reference additionally now to FIG. 6, a schematic illustration of another embodiment of a representative data read, global data read driver circuit 200 in accordance with an implementation of the technique of the present invention is shown. The circuit 200 comprises, in pertinent part, charge sharing circuitry 202 as shown. The charge sharing circuitry comprises P-channel transistor 204 in series with N-channel transistor 206 and having their common connected gate terminals coupled to receive an HCLKB signal. The node intermediate transistors 204 and 206 is connected to one terminal of capacitor 208 (C3) while the other terminal is coupled to the node intermediate P-channel transistor 210 and N-channel transistor 212 which are coupled between voltage sources VDH and VDL as shown. The source terminals of transistors 204, 210, 214 and 220 are all coupled to VDH while the source terminals of transistors 206, 212, 216 and 222 are all coupled to VDL.

In like manner, P-channel transistor 214 and series connected N-channel transistor 216 are also coupled between VDH and VDL. The gate terminals of transistors 210, 212, 214 and 216 are coupled together to receive the HCLK signal. The node intermediate transistors 214 and 216 is coupled to one terminal of capacitor 218 (C6) which has its other terminal coupled to the node intermediate series connected P-channel transistor 220 and N-channel transistor 222 which have their common connected gate terminals receiving the HCLKB signal.

Series connected P-channel transistors 224 and 226, with their gate terminals respectively receiving the GDRLB an GPREB signals, couple VCC to the source terminal of transistor 204 while series connected N-channel transistors 236 and 238, with their gate terminals respectively receiving the PRE and DRLB signals, couple VSS to the source terminal of transistor 206. Similarly, series connected P-channel transistors 232 and 234, with their gate terminals respectively receiving the GDRL an GPREB signals, couple VCC to the source terminal of transistor 220 while series connected N-channel transistors 244 and 246, with their gate terminals respectively receiving the PRE an DRL signals, couple VSS to the source terminal of transistor 222. The node intermediate transistors 224 and 226 defines the GDR line while the node intermediate transistors 232 and 234 defines the GDRB line. Correspondingly, the node intermediate transistors 236 and 238 defines the DR line while the node intermediate transistors 244 and 246 defines the DRB line. A capacitance of substantially 250 fF couples the GDR, GDRB, DR and DRB lines to circuit ground as shown.

Figure 7:
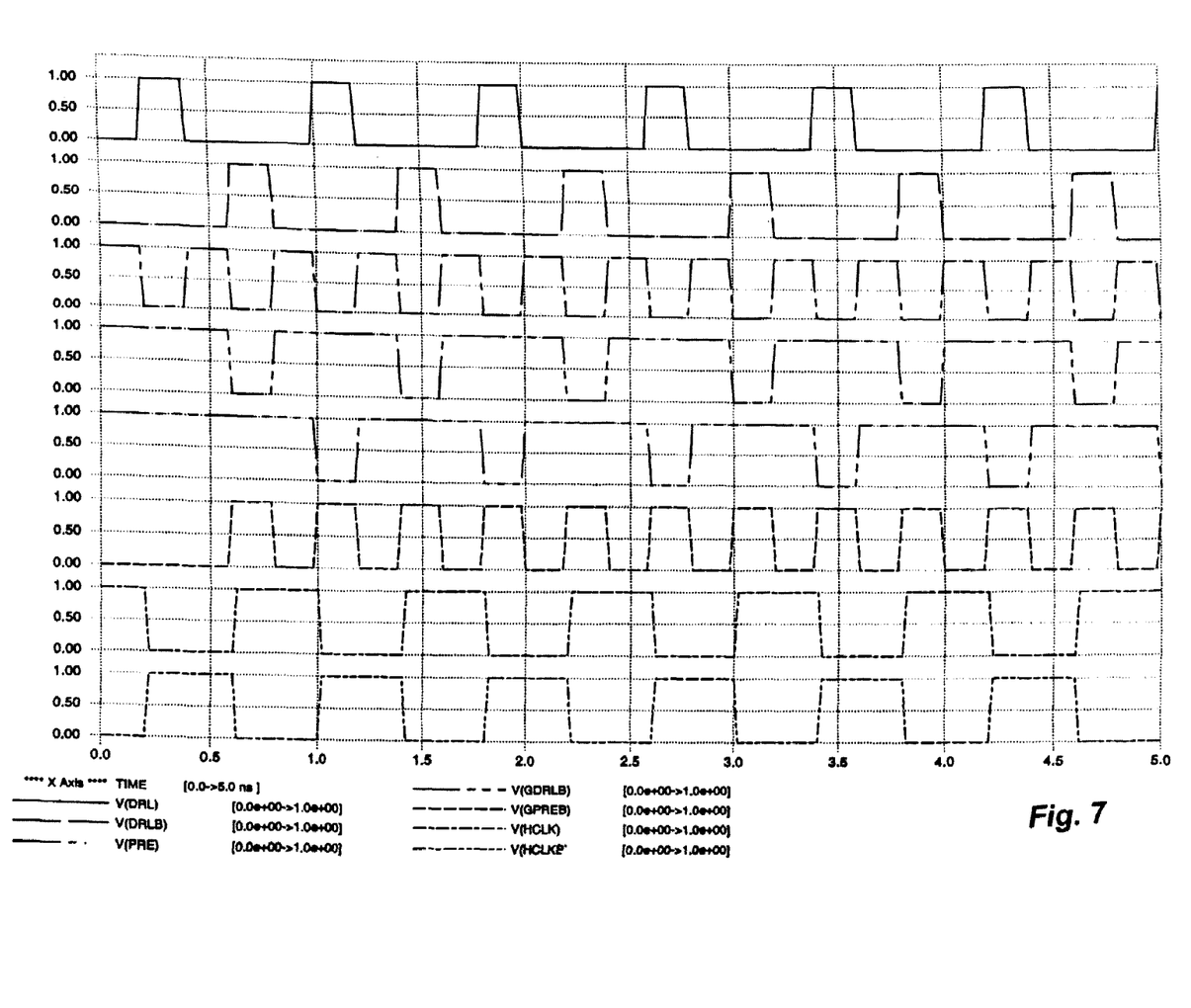
FIG. 7 is a series of waveforms produced by the circuit 200 of the preceding figure illustrating, in descending order, the signals on the DRL, DRLB, PRE, GDRL, GDRLB, GPREB, HCLK an HCLKB lines with capacitors C3 and C6 having a capacitance of 12 fF.

With reference additionally now to FIG. 7, a series of waveforms produced by the circuit 200 of the preceding figure is shown illustrating, in descending order, the signals on the DRL, DRLB, PRE, GDRL, GDRLB, GPREB, HCLK an HCLKB lines. In this illustration, capacitors C3 and C6 have a capacitance of 12 fF.

Figure 8:
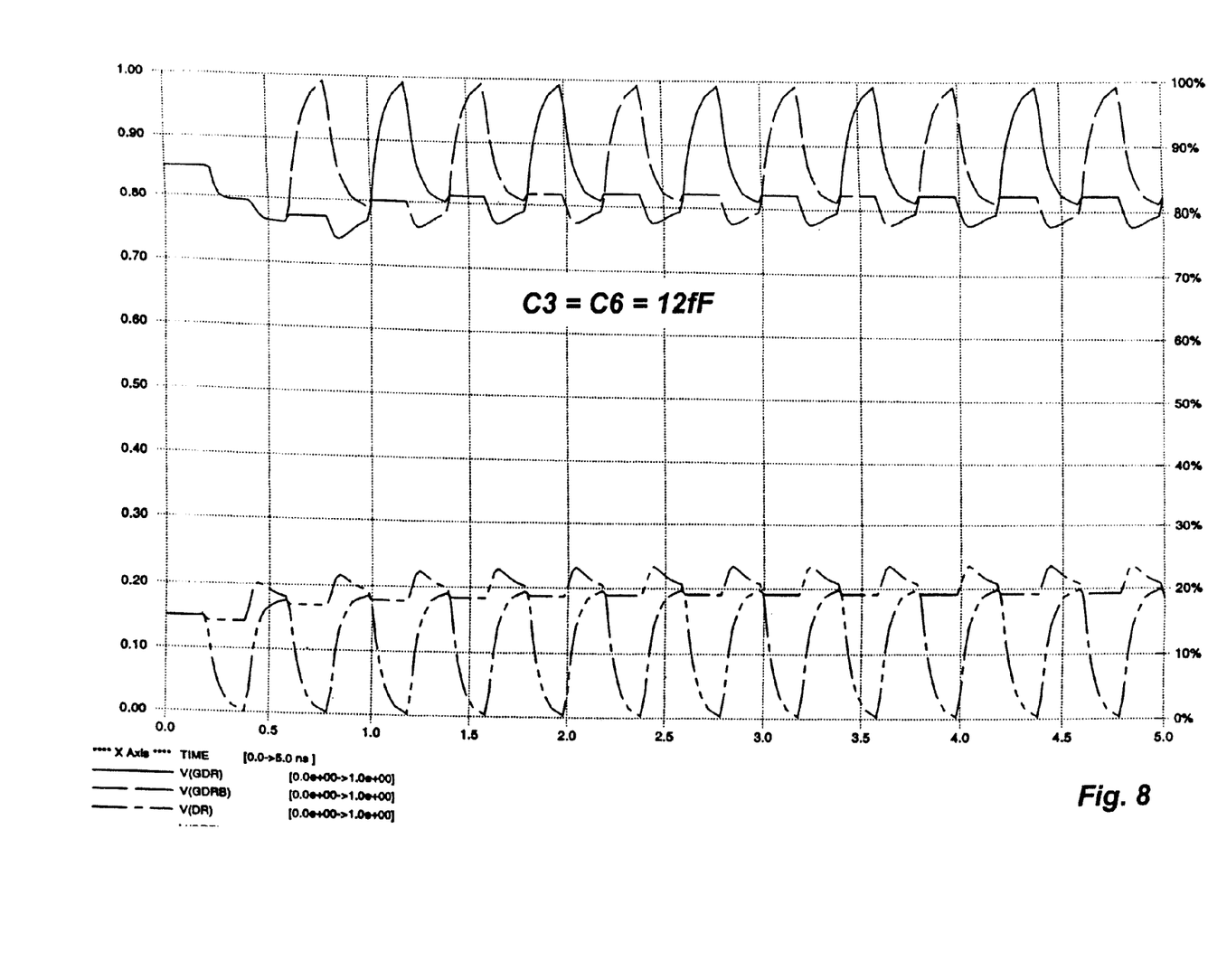
FIG. 8 is an additional series of waveforms produced by the circuit 200 of FIG. 6 illustrating the signals on the GDR, GDRB, DR and DRB lines for values of capacitors C3 and C6 of 12 fF.

With reference additionally now to FIG. 8, an additional series of waveforms produced by the circuit 200 of FIG. 6 is shown illustrating the signals on the GDR, GDRB, DR and DRB lines for values of capacitors C3 and C6 of substantially 12 fF. At the top of the figure, the GDR and GDRB lines are shown to transition between substantially 1.0 volts to 1.0 volts minus 220 millivolts while at the bottom of the figure, the DR an DRB lines are shown to transition between substantially 0.0 volts and 220 millivolts.

Figure 9:
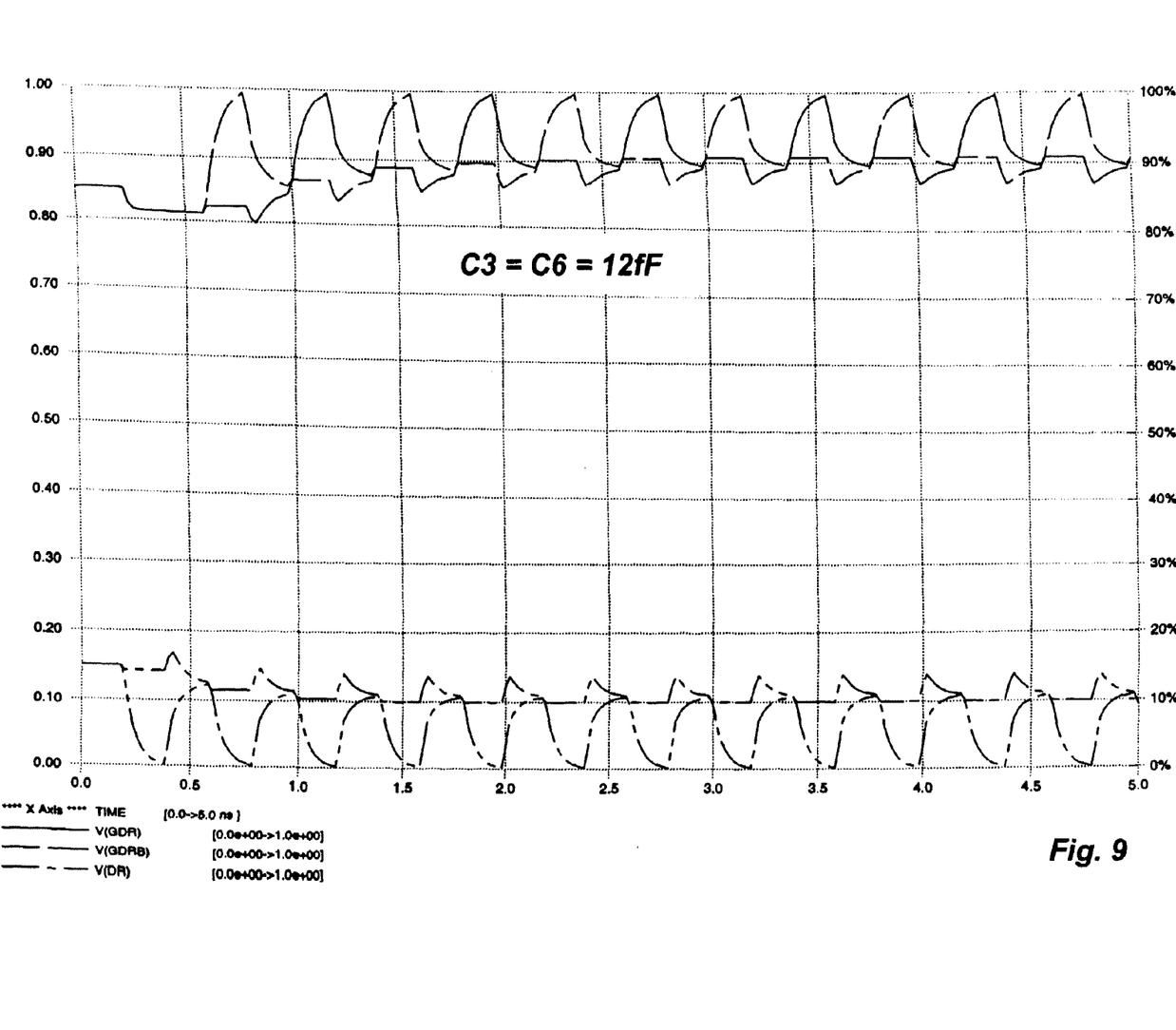
FIG. 9 is a further series of waveforms produced by the circuit 200 of FIG. 6 illustrating the signals on the GDR, GDRB, DR and DRB lines for values of capacitors C3 and C6 of 2 fF.

With reference additionally now to FIG. 9, a further series of waveforms produced by the circuit 200 of FIG. 6 is shown illustrating the signals on the GDR, GDRB, DR and DRB lines for values of capacitors C3 and C6 of substantially 2 fF. Again at the top of the figure, the GDR and GDRB lines are shown to transition between substantially 1.0 volts to 1.0 volts minus 125 millivolts while at the bottom of the figure, the DR an DRB lines are shown to transition between substantially 0.0 volts and 125 millivolts.

Figure 10:
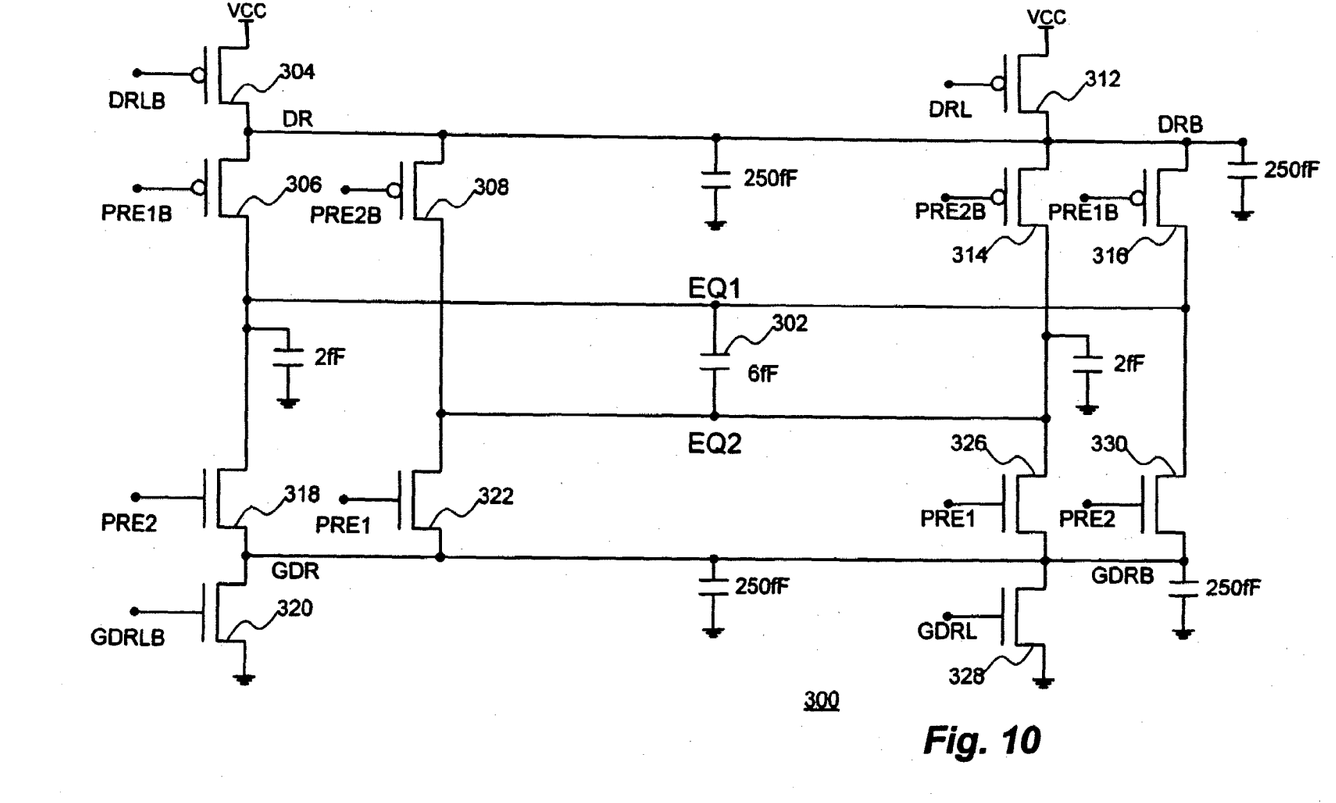
FIG. 10 is a schematic illustration of yet another embodiment of a representative data read, global data read driver circuit in accordance with an implementation of the technique of the present invention.

With reference additionally now to FIG. 10, a schematic illustration of yet another embodiment of a representative data read, global data read driver circuit 300 in accordance with an implementation of the technique of the present invention is shown. The circuit 300 comprises, in pertinent part a capacitor 302 (in this embodiment substantially 6 fF) coupled between nodes EQ1 and EQ2.

Series connected P-channel transistors 304 and 306, having the signals DRLB and PRE1B respectively coupled to their gate terminals, couple VCC to the node EQ1. The node intermediate the transistors 304 and 306 defines line DR. Further, series connected N-channel transistors 318 and 320, having the signals PRE2 and GDRLB respectively coupled to their gate terminals, couple VSS to the node EQ1. The node intermediate the transistors 318 and 320 defines line GDR. P-channel transistor 308, having its gate terminal coupled to receive the PRE2B signal, couples the DR line to node EQ2 which, in turn, is coupled to the GDR line through N-channel transistor 322 which has its gate terminal coupled to receive the PRE1 signal.

In like manner, series connected P-channel transistors 312 and 314, having the signals DRL and PRE2B respectively coupled to their gate terminals, couple VCC to the node EQ21. The node intermediate the transistors 312 and 314 defines line DRB. Further, series connected N-channel transistors 326 and 328, having the signals PRE1 and GDRL respectively coupled to their gate terminals, couple VSS to the node EQ2. The node intermediate the transistors 326 and 328 defines line GDRB. P-channel transistor 316, having its gate terminal coupled to receive the PRE1B signal, couples the DRB line to node EQ1 which, in turn, is coupled to the GDRB line through N-channel transistor 330 which has its gate terminal coupled to receive the PRE2 signal.

In this particular embodiment as illustrated, the DR line is coupled directly to the DRB line while the GDR line is also coupled directly to the GDRB line as shown. A capacitance of substantially 250 fF couples the DR, DRB, GDR and GDRB lines to circuit ground while the EQ1 and EQ2 lines are coupled to circuit ground through a capacitance of substantially 2 fF.

Figure 11:
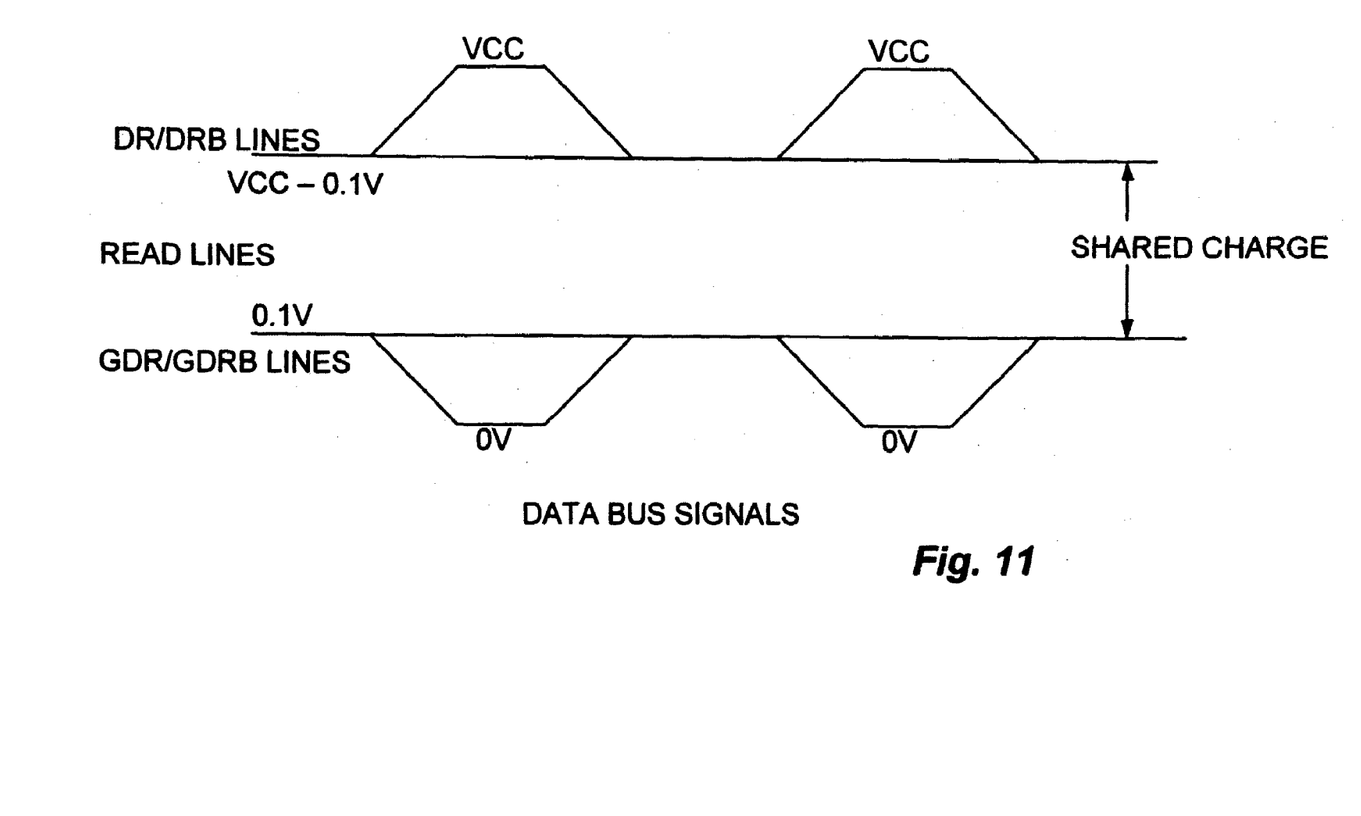
FIG. 11 is a simplified series of waveforms illustrating the signals on the complementary data read (DR, DRB) and global data read (GDR, GDRB) lines in accordance with the technique of the present invention as the former transition between VCC and VCC −0.1V and the latter transition between VSS (0V) and 0.1V.

With reference additionally now to FIG. 11, a simplified series of waveforms is shown illustrating the signals on the complementary data read (DR, DRB) and global data read (GDR, GDRB) lines in accordance with the technique of the present invention as the former transition between VCC and VCC −0.1V and the latter transition between VSS (0V) and 0.1V.

Figure 12:
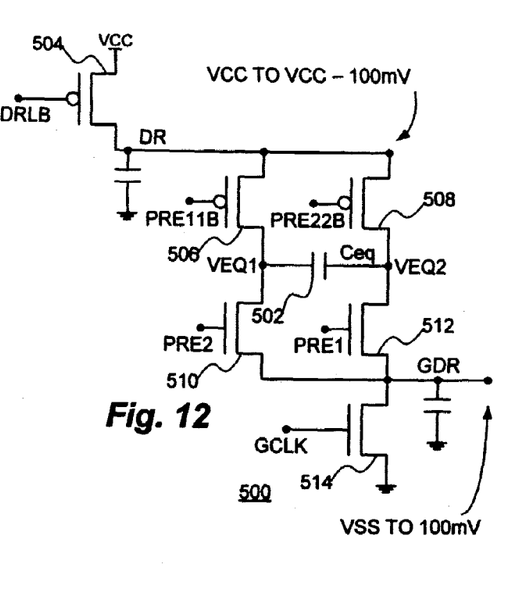
FIG. 12 is a schematic illustration of still another embodiment of a representative data read, global data read driver circuit in accordance with an implementation of the technique of the present invention.

With reference additionally now to FIG. 12, a schematic illustration of still another embodiment of a representative data read, global data read driver circuit 500 in accordance with an implementation of the technique of the present invention is shown. The circuit 500 comprises a capacitor 502 (Ceq) coupled between nodes VEQ1 and VEQ2 as shown.

The circuit 500 further comprises a P-channel transistor 504 coupled between VCC and the DR line, with its gate terminal coupled to receive the DRLB signal. A P-channel transistor 506 couples the DR line to the VEQ1 node and has its gate terminal coupled to receive the PRE11B signal. Another P-channel transistor 508 couples the DR line to the VEQ2 node and has its gate terminal coupled to receive the PRE22B signal.

An N-channel transistor 510 couples the VEQ1 node to the GDR line and has its gate terminal coupled to receive the PRE2 signal. Another N-channel transistor 512 couples the VEQ2 node to the GDR line and has its gate terminal coupled to receive the PRE1 signal. An additional N-channel transistor 514 couples the GDR line to circuit ground and has its gate terminal coupled to receive the GCLK signal. As illustrated, in this embodiment of the present invention, the DR line transitions substantially between VCC and VCC −100 millivolts while the GDR line transitions between VSS and 100 millivolts. A parasitic capacitance couples the DR and GDR lines to circuit ground as indicated.

Figure 13:
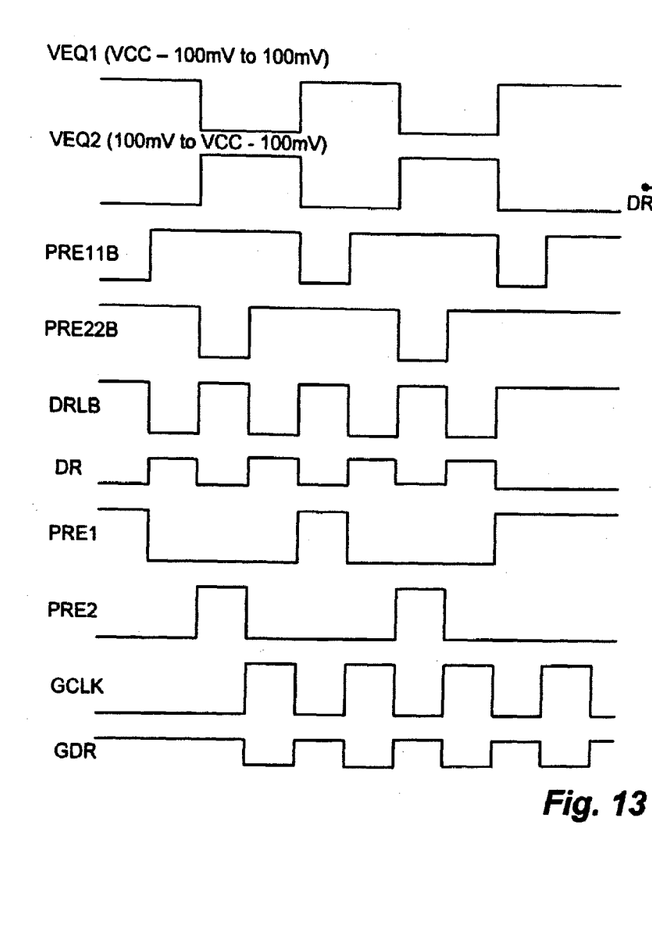
FIG. 13 is a simplified series of waveforms produced by the circuit 500 of the preceding figure illustrating the signals on the VEQ1, VEQ2, PRE11B, PRE22B, DRLB, DR, PRE1, PRE2, GCLK and GDR lines.

With reference additionally now to FIG. 13, a simplified series of waveforms produced by the circuit 500 of the preceding figure is shown illustrating the signals on the VEQ1, VEQ2, PRE11B, PRE22B, DRLB, DR, PRE1, PRE2, GCLK and GDR lines.

As can be seen, the PRE11B signal activates transistor 506 substantially concurrently with the PRE1 signal activating transistor 512 while transistors 508 and 510 are not activated. In like manner, when transistors 506 and 512 are not activated, the PRE22B signal activates transistor 508 substantially concurrently with the PRE2 signal activating transistor 510. The DLRB signal activates transistor 504 at substantially the same time that the GCLK signal activates transistor 514.

Figure 14:
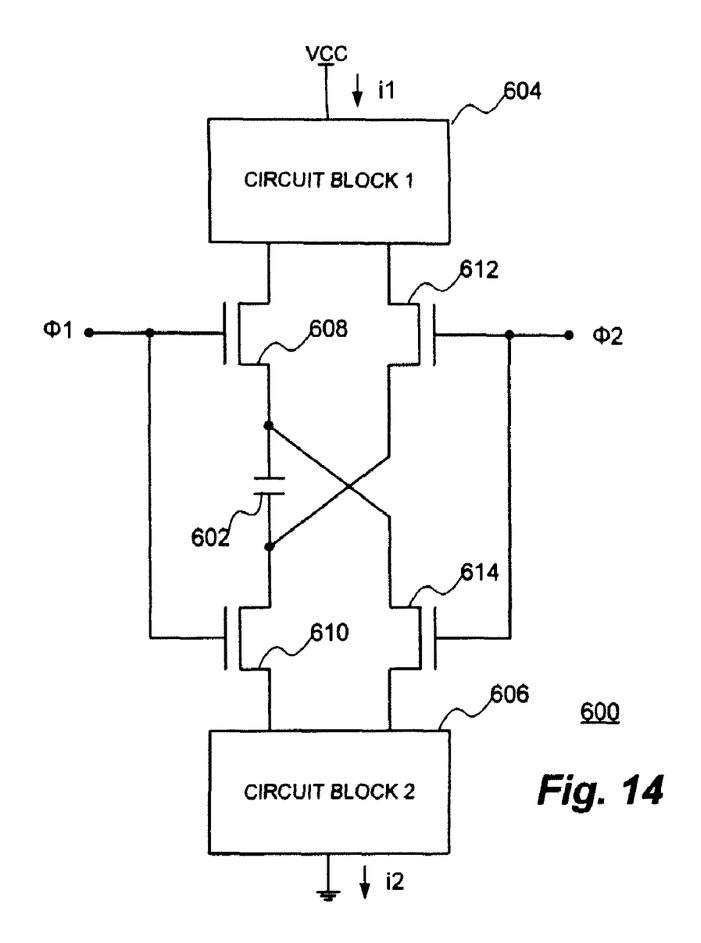
FIG. 14 is a simplified schematic illustration of yet another embodiment of a switched capacitance, charge sharing circuit in accordance with the technique of the present invention.

With reference additionally now to FIG. 14, a simplified schematic illustration of yet another embodiment of a switched capacitance, charge sharing circuit 600 in accordance with the technique of the present invention is shown. The circuit 600 comprises a capacitor 602 which has one terminal thereof coupled to a terminal of transistor 608 and 614 and another terminal thereof coupled to a terminal of transistors 610 and 612. The gate terminals of transistors 608 and 610 receive a signal φ1 having a first phase while the gate terminals of transistors 612 and 614 receive a signal φ2 having a differing phase. The remaining terminals of transistors 608 and 612 are coupled to a first circuit block 604 while the remaining terminals of transistors 610 and 614 are coupled to circuit block 606. The circuit block 604 is coupled, for example, to a supply voltage source VCC for receiving a current i1 while the circuit block 606 is coupled to circuit ground (or VSS) and having a current therethrough indicated as i2.

While there have been described above the principles of the present invention in conjunction with specific circuit implementations, capacitances and voltage ranges, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A charge sharing circuit for first and second pairs of complementary signal lines comprising:
    a capacitor coupled between first and second circuit nodes;
    a first input circuit having an output coupled to a first one of said first pair of complementary signal lines, said first input circuit being coupled between a supply voltage source and a second one of said first pairs of complementary signal lines;
    a second input circuit having an output coupled to said second one of said first pair of complementary signal lines, said first input circuit being coupled between said supply voltage source and said first circuit node;
    a first switching device for selectively coupling said first one of said first pair of complementary signal lines to said first circuit node;
    a third input circuit having an output coupled to a first one of said second pair of complementary signal lines, said third input circuit being coupled between a reference voltage level and a second one of said second pair of complementary signal lines;
    a fourth input circuit having an output coupled to said second one of said second pair of complementary signal lines, said fourth input circuit being coupled between said reference voltage level and said second circuit node;
    a first output circuit coupled to said first and second ones of said first pair of complementary signal lines and said second circuit node;
    a second output circuit coupled to said first and second ones of said second pair of complementary signal lines and said first circuit node; and
    a second switching device for selectively coupling said first one of said second pair of complementary signal lines to said second circuit node.

2. The circuit of claim 1 wherein said first, second, third and fourth input circuits each comprise series coupled transistors having their respective output at a node intermediate said series coupled transistors.

3. The circuit of claim 1 wherein said first and second input circuits each comprise first and second series coupled P-channel transistors.

4. The circuit of claim 1 wherein said third and fourth input circuits each comprise first and second series coupled N-channel transistors.

5. The circuit of claim 1 wherein said first and second switching devices comprise MOS transistors.

6. The circuit of claim 5 wherein said first switching device comprises a P-channel transistor.

7. The circuit of claim 5 wherein said second switching device comprises an N-channel transistor.

8. The circuit of claim 1 wherein said first output circuit comprises first and second P-channel transistors respectively coupled between said first and second ones of said first pair of complementary signal lines and said second circuit node.

9. The circuit of claim 1 wherein said second output circuit comprises first and second N-channel transistors respectively coupled between said first and second ones of said second pair of complementary signal lines and said first circuit node.

10. The circuit of claim 1 wherein a capacitance value of said capacitor determines a signal level between said first and second ones of said first and second pairs of complementary signal lines.

11. The circuit of claim 10 wherein an increase in said capacitance value increases said signal level between said first and second ones of said first and second pairs of complementary signal lines.

12. The circuit of claim 10 wherein a decrease in said capacitance value decreases said signal level between said first and second ones of said first and second pairs of complementary signal lines.

13. The circuit of claim 1 wherein said first and second pairs of complementary signal lines comprise local and global data read lines in an integrated circuit memory array.

14. A charge sharing circuit for first and second pairs of complementary signal lines comprising:
a capacitor coupled between first and second circuit nodes;
a first circuit coupled between a supply voltage source and a reference voltage level and coupled to first ones of said first and second pairs of complementary signal lines and said first circuit node;
a second circuit coupled between said supply voltage source and said reference voltage level and coupled to second ones of said first and second pairs of complementary signal lines and said second circuit node;
a third circuit coupled between said first ones of said first and second pairs of complementary signal lines and to said second circuit node; and
a fourth circuit coupled between said second ones of said first and second pairs of complementary signal lines and to said first circuit nodes
wherein said first and second pairs of complementary signal lines comprise local and global data read lines in an integrated circuit memory array.

15. The circuit of claim 14 wherein said first and second circuits comprise series coupled MOS transistors.

16. The circuit of claim 15 wherein said series coupled MOS devices comprise first and second P-channel transistors and first and second N-channel transistors.

17. The circuit of claim 14 wherein said third and fourth circuits comprise series coupled MOS transistors.

18. The circuit of claim 17 wherein said series coupled MOS transistors comprise a P-channel transistor and an N-channel transistor.

19. The circuit of claim 14 further comprising:
first and second transistors for respectively coupling together said first and second ones of said first and second pairs of complementary signal lines.

20. The circuit of claim 19 wherein said first transistor comprises a P-channel device and said second transistor comprises an N-channel device.

21. The circuit of claim 14 wherein a capacitance value of said capacitor determines a signal level between said first and second ones of said first and second pairs of complementary signal lines.

22. The circuit of claim 21 wherein an increase in said capacitance value increases said signal level between said first and second ones of said first and second pairs of complementary signal lines.

23. The circuit of claim 21 wherein a decrease in said capacitance value decreases said signal level between said first and second ones of said first and second pairs of complementary signal lines.

24. A data read driver for an integrated circuit memory array comprising:
a first transistor responsive to a data read signal for coupling a supply voltage to a local data read line;
a second transistor responsive to a global clock signal for coupling a reference voltage level to a global data read line; and
a charge sharing circuit coupled between said local data read line and said global data read line comprising a capacitor coupled between first and second circuit nodes, first and second switching devices for respectively coupling said first and second circuit nodes to said local data read line, and third and fourth switching devices for respectively coupling said first and second circuit nodes to said global data read line.

25. The data read driver of claim 24 wherein said first and second switching devices comprise P-channel transistors and said third and fourth transistors comprise N-channel transistors.

26. The data read driver of claim 24 wherein said first and fourth switching devices are controlled by first and second timing signals having substantially opposite phases and said second and third switching devices are controlled by third and fourth timing signals having substantially opposite phases.

27. The data read driver circuit of claim 24 wherein said first and fourth switching devices are activated substantially concurrently while said second and third switching devices are not activated.

28. The data read driver circuit of claim 24 wherein said second and third switching devices are activated substantially concurrently while said first and fourth switching devices are not activated.

29. The data read driver circuit of claim 24 wherein a capacitance value of said capacitor determines a signal level between said first and second ones of said first and second pairs of complementary signal lines.

30. The circuit of claim 29 wherein an increase in said capacitance value increases a signal level on said local data read and said global data read signal lines.

31. The circuit of claim 29 wherein a decrease in said capacitance value decreases a signal level on said local data read and said global data read signal lines.

32. A charge sharing method comprising:
providing a capacitor having first and second terminals thereof;
firstly coupling a first signal line to said first terminal of said capacitor and coupling a second signal line to said second terminal of said capacitor;

firstly decoupling said first and second signal lines from said first and second terminals of said capacitor respectively;

secondly coupling said first signal line to said second terminal of said capacitor and coupling said second signal line to said first terminal of said capacitor;

secondly decoupling said first and second signal lines from said second and first terminals of said capacitor respectively; and repeating said process of firstly coupling, firstly decoupling, secondly coupling and secondly decoupling.

33. The method of claim 32 further comprising:

selectively coupling said first signal line to a supply voltage source; and selectively coupling said second signal line to a reference voltage level.

34. The method of claim 32 wherein said process of firstly coupling, firstly decoupling, secondly coupling and secondly decoupling are carried out by MOS transistors.

35. The method of claim 32 wherein a capacitance value of said capacitor determines a signal level on said first and second signal lines.

36. The method of claim 35 wherein an increase in said capacitance value increases a signal level on said first and second signal lines.

37. The method of claim 35 wherein a decrease in said capacitance value decreases a signal level on said first and second signal lines.

38. The method of claim 35 wherein said capacitance value of said capacitor is selected in relationship to a capacitance of said first and second signal lines.

* * * * *